US006953918B2

United States Patent
Kano et al.

(10) Patent No.: US 6,953,918 B2
(45) Date of Patent: Oct. 11, 2005

(54) HEATING APPARATUS WHICH HAS ELECTROSTATIC ADSORPTION FUNCTION, AND METHOD FOR PRODUCING IT

(75) Inventors: Shoji Kano, Gunma (JP); Kenji Satoh, Gunma (JP); Kenji Ito, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/695,870

(22) Filed: Oct. 30, 2003

(65) Prior Publication Data

US 2004/0108314 A1 Jun. 10, 2004

(30) Foreign Application Priority Data

Nov. 1, 2002 (JP) ........................................ 2002-319970

(51) Int. Cl.[7] ................................................ H05B 3/16
(52) U.S. Cl. ......................... 219/543; 219/542; 219/544
(58) Field of Search ............................... 219/543, 544, 219/548, 552, 553, 213; 361/234

(56) References Cited

U.S. PATENT DOCUMENTS

| | | | |
|---|---|---|---|
| 5,382,469 A | | 1/1995 | Kubota et al. |
| 5,663,865 A | * | 9/1997 | Kawada et al. ............. 361/234 |
| 5,748,436 A | * | 5/1998 | Honma et al. .............. 361/234 |
| 6,108,189 A | | 8/2000 | Weldon et al. |
| 6,204,489 B1 | * | 3/2001 | Katsuda et al. ............. 219/544 |
| 6,259,592 B1 | | 7/2001 | Ono |
| 6,294,771 B2 | * | 9/2001 | Katsuda et al. ............. 219/544 |
| 6,678,143 B2 | * | 1/2004 | Masuda et al. ............. 361/234 |
| 6,687,113 B2 | * | 2/2004 | Saito et al. ................. 361/234 |
| 6,728,091 B2 | * | 4/2004 | Tsuruta et al. .............. 361/234 |
| 6,730,276 B2 | * | 5/2004 | Kosakai et al. ............ 422/186.05 |

FOREIGN PATENT DOCUMENTS

| | | |
|---|---|---|
| EP | 0 692 814 A1 | 1/1996 |
| JP | A 52-67353 | 6/1977 |
| JP | A 59-124140 | 7/1984 |
| JP | A 63-241921 | 10/1988 |
| JP | A 04-124076 | 4/1992 |
| JP | A 04-358074 | 12/1992 |
| JP | A 05-109876 | 4/1993 |
| JP | A 05-129210 | 5/1993 |
| JP | A 07-10665 | 1/1995 |
| JP | 200101525 A * | 1/2001 |

OTHER PUBLICATIONS

Toshiya Watanabe, "Electrostatic Characteristics of Ceramic Electrostatic Chuck", New Ceramics (1994) No. 2, pp. 49–53.

* cited by examiner

Primary Examiner—Robin O. Evans
Assistant Examiner—Vinod Patel
(74) Attorney, Agent, or Firm—Oliff & Berridge, PLC

(57) ABSTRACT

There is disclosed a heating apparatus which has an electrostatic adsorption function and which comprises at least a supporting substrate, an electrode for electrostatic adsorption formed on a surface of one side of the supporting substrate, a heating layer formed on a surface of the other side of the supporting substrate, and an insulating layer formed so that it may cover the electrode for electrostatic adsorption and the heating layer wherein a volume resistivity of the insulating layer is varied in a plane. Thus, there can be provided a heating apparatus which has an electrostatic adsorption function wherein uniformity of a temperature distribution in a plane of the wafer when the wafer is heated can be improved, and the wafer can be heat-treated uniformly.

10 Claims, 3 Drawing Sheets (a)

(b)

(c)

(d)

HEATING APPARATUS WHICH HAS ELECTROSTATIC ADSORPTION FUNCTION, AND METHOD FOR PRODUCING IT

BACKGROUND OF THE INVENTION

1. Field of the Invention

The present invention relates to a heating apparatus which has an electrostatic adsorption function, and specifically to a heating apparatus which has an electrostatic adsorption function used suitably for a heating process of a semiconductor wafer in a production process and an inspection process of a semiconductor device or the like including a process of raising a temperature.

2. Description of the Related Art

Conventionally, a heater around which a metal wire is coiled has been used for heating a semiconductor wafer in a process of production of a semiconductor device. However, when the heater was used, there was a problem of metal contamination to the semiconductor wafer. Therefore, there is proposed use of a wafer heating apparatus united with ceramics which uses a ceramic thin film as a heating layer in recent years (for example, see Japanese Patent Application Laid-open (KOKAI) No. 4-124076).

Among them, when heating a wafer, for example by a molecular beam epitaxy, CVD, sputtering, or the like, it is effective to use a composite ceramic heater consisting of a pyrolytic boron nitride (PBN) and a pyrolytic graphite (PG) with a high purity which does not generate out gas and is excellent in a thermal shock resistance (see Japanese Patent Application Laid-open (KOKAI) No. 63-241921). The heater consisting of such materials has an advantage that it is easily installed compared with a tantalum wire heater which has been used until now, troubles such as thermal deformation, burnout, and short-circuit are not caused, and thus it is easy to use, and comparatively uniform heating is easily achieved since it is an area heater.

Moreover, an electrostatically adsorbing apparatus is generally used for fixing a semiconductor wafer on a heater when heating of a semiconductor wafer in reduced pressure atmosphere, and the material therefor has shifted to ceramics from resins with a tendency of higher temperature process (see Japanese Patent Application Laid-open (KOKAI) Nos. 52-67353 and 59-124140).

Recently, there is proposed a wafer heating apparatus which has the electrostatic adsorption function wherein these wafer heating apparatuses united with ceramics and electrostatically adsorbing apparatus are combined. For example, an apparatus wherein alumina is used for the insulating layer of an electrostatically adsorbing apparatus has been used in a low-temperature region such as an etching process (see New-ceramics (7) p49–53, 1994), and an apparatus wherein pyrolytic boron nitride is used for an insulating layer of an electrostatically adsorbing apparatus has been used in an elevated-temperature region such as a CVD process (see Japanese Patent Application Laid-open (KOKAI) Nos. 4-358074, 5-109876, 5-129210, and 7-10665).

Generally, in such an electrostatically adsorbing apparatus, an electrostatic adsorption power will get strong if a volume resistivity of an insulating layer gets low, for example as indicated in the above-mentioned reference (New ceramics (7), p49–53, 1994). However, the device will be broken due to leakage current if it is too low. Therefore, when an insulating layer is formed in an electrostatically adsorbing apparatus, the insulating layer is formed so that the insulating layer may have a suitable volume resistivity uniformly in a plane by a sintering method, a CVD method, or the like.

Although the electrostatically adsorbing apparatus made of ceramics has been installed in a molecular beam epitaxy apparatus, a CVD apparatus, a sputtering apparatus, or the like as descried above, there have been caused problems of nonuniformity of device characteristics and lowering of yield due to aggravation of a temperature distribution of the electrostatically adsorbing apparatus itself depending on the heat environment to be used, aggravation of a temperature distribution of the wafer itself resulting from contact of gas or plasma to the wafer or the like, with a tendency of higher integration of a semiconductor device in recent years.

Moreover, a so-called single wafer processing in which one wafer is processed at a time is increasingly adopted in a CVD apparatus and a sputtering apparatus, with a tendency of larger diameter of a wafer. As described above, in the case that the wafer with a large diameter is processed, the processing chamber for processing a wafer in a single wafer processing, a cooling system, and a processing gas system are arranged in a concentric configuration centering on the wafer in many cases. Therefore, when a wafer is subjected to heat-treatment, a temperature gradient of the wafer arises in the shape of a concentric circle, and thus some of the heat-treated wafers may have semiconductor device characteristics which are different in the shape of a concentric circle from a center of the wafer. Therefore, the above-mentioned problems, such as uniformity of the device characteristics and lowering of yield are becoming much more serious.

SUMMARY OF THE INVENTION

The present invention has been accomplished to solve the above-mentioned previous problems. An object of the present invention is to provide a heating apparatus which has an electrostatic adsorption function in which uniformity of a temperature distribution in a plane of a wafer at the time of heat-treatment of the wafer can be improved and th wafer can be heat-treated uniformly.

To achieve the above mentioned object, according to the present invention, there is provided a heating apparatus which has an electrostatic adsorption function and which comprises at least a supporting substrate, an electrode for electrostatic adsorption formed on a surface of one side of the supporting substrate, a heating layer formed on a surface of the other side of the supporting substrate, and an insulating layer formed so that it may cover the electrode for electrostatic adsorption and the heating layer characterized in that a volume resistivity of the insulating layer is varied in a plane.

As described above, in the heating apparatus which has the electrostatic adsorption function and which comprises at least a supporting substrate, an electrode for electrostatic adsorption, A heating layer and an insulating layer, if a volume resistivity of the insulating layer is varied in a plane, the electrostatic adsorption power at the time of adsorbing the wafer to the heating apparatus can be changed in a plane and can be controlled. Therefore, since the turbulence of the temperature balance in a plane of the wafer produced at the time of heating the wafer can be offset and the uniformity of the temperature distribution of the wafer can be significantly improved, by utilizing the difference in the electrostatic adsorption power, there can be obtained the heating apparatus which has the electrostatic adsorption function in which a wafer can be heat-treated uniformly.

At this time, it is desirable that the variation of the volume resistivity of the insulating layer is a variation in a shape of a concentric circle.

As described above, if the volume resistivity of the insulating layer is varied in the shape of a concentric circle, especially in the case that the wafer with a large diameter will be subjected to a heat-treatment in a single wafer processing, the wafer can be heated uniformly, and the conventional problems due to aggravation of the temperature distribution generated in the shape of a concentric circle, such as uniformity of device characteristics and lowering of the yield, can be surely prevented.

In this case, it is preferable that the volume resistivity is varied in the range of $10^8$ to $10^{18}$ $\Omega \cdot cm$.

As described above, if the volume resistivity is varied in the range of $10^8$ to $10^{18}$ $\Omega \cdot cm$, sufficient electrostatic adsorption power which can adsorb a wafer certainly can be obtained, and breakage of the device or the like is not caused by leakage current.

Moreover, it is preferable that the insulating layer consists of silicon nitride, boron nitride, a mixture of boron nitride and aluminium nitride, alumina, or aluminium nitride, and the insulating layer contains impurity in the range of 0.001% to 20%. Especially, it is preferable that the boron nitride is pyrolytic boron nitride. Furthermore, it is preferable that the impurity contained in the insulating layer is at least one kind of impurity selected from the group consisting of silicon, carbon, boron, germanium, titanium, aluminium and nitrides, oxides and borides thereof.

As described above, if the insulating layer consists of any one of the above-mentioned materials, the insulating layer can be easily formed, and excellent heat-resistance and strength can be obtained. Therefore, the insulating layer having a long lifetime which can be used for a long time can be obtained. Moreover, if the impurity is contained in the range of 0.001% to 20% in the insulating layer, the volume resistivity of the insulating layer can be easily controlled in the range of $10^8$ to $10^{18}$ $\Omega \cdot cm$. Especially, if the impurity contained in this insulating layer is at least one kind of impurity selected from the group consisting of silicon, carbon, boron, germanium, titanium, aluminium and nitrides, oxides and borides thereof, the volume resistivity can be controlled easily and with high precision.

Moreover, in the heating apparatus which has the electrostatic adsorption function according to the present invention, it is preferable that the supporting substrate consists of any one of a silicon nitride sintered body, a boron nitride sintered body, a mixed sintered body of boron nitride and aluminium nitride, an alumina sintered body, an aluminium nitride sintered body, and pyrolytic boron nitride coated graphite.

If the supporting substrate consists of such a material, there can be obtained the heating apparatus by which heat-treatment can be performed stably for a long time, since it is excellent in a heat-resistance and strength.

Moreover, it is preferable that the electrode for electrostatic adsorption and/or the heating layer are formed by screen printing or chemical vapor deposition.

If the electrode for electrostatic adsorption and a heating layer are formed by screen printing or chemical vapor deposition, it can be formed in a desired thickness uniformly on the supporting substrate, a bonding strength of the electrode for electrostatic adsorption or a heating layer with the supporting substrate or with the insulating layer formed thereon can get strong.

At this time, it is preferable that the electrode for electrostatic adsorption and/or the heating layer consist of any one of gold, a platinum group, silver, a mixture of gold or a platinum group and silver, titanium, tungsten, tantalum, molybdenum, pyrolytic graphite and pyrolytic graphite containing boron and/or boron carbide.

If the electrode for electrostatic adsorption consists of the above materials, the electrode can be formed easily and electrostatic adsorption of the wafer can also be performed suitably. Moreover, if the heating layer consists of the above materials, the heating layer can be formed easily and heat generation can be performed efficiently, without causing troubles, such as thermal deformation, burnout, and short-circuit.

Furthermore, according to the present invention, there is provided a method for producing a heating apparatus which has an electrostatic adsorption function by forming at least an electrode for electrostatic adsorption and a heating layer on a supporting substrate and then forming an insulating layer so that it may cover the electrode for electrostatic adsorption and the heating layer characterized in that the insulating layer is formed so that a volume resistivity may be varied in the insulating layer.

According to the method for producing a heating apparatus which has an electrostatic adsorption function of the present invention as described above, it is possible to produce a heating apparatus which has an electrostatic adsorption function in which the turbulence of the temperature balance in a plane of the wafer generated during heating the wafer can be offset to improve significantly the temperature distribution of the wafer, and a wafer can be heat-treated uniformly.

As described above, according to the heating apparatus which has the electrostatic adsorption function of the present invention, since a volume resistivity of the insulating layer is varied in a plane, the electrostatic adsorption power at the time of adsorbing the wafer to the heating apparatus can be controlled in a plane. Thereby, the turbulence of the temperature balance in a plane of the wafer generated at the time of heating the wafer can be offset, and the uniformity of the temperature distribution of the wafer can be significantly improved, and thus the wafer can be heat-treated uniformly.

DESCRIPTION OF THE INVENTION AND EMOBDIMENT

The embodiments of the present invention will now be described. However, the invention is not limited thereto.

The inventors of the present invention repeated experiments and studied earnestly in order to improve a temperature distribution of a wafer in heat-treatment, using skillfully the characteristics that an electrostatic adsorption power which adsorbs a wafer becomes strong when the volume resistivity of an insulating layer becomes low, and it becomes weak when a volume resistivity of the insulating layer becomes high in a heating apparatus which has an electrostatic adsorption function. Consequently, they found in light with the fact that heat conduction is proved when the electrostatic adsorption power becomes strong during heating of the wafer, that the temperature distribution of the wafer can be significantly improved by investigating the wafer temperature distribution at the time of heating the wafer beforehand under a certain heat environment, and changing the appropriately the volume resistivity of the insulating layer in a heating apparatus depending on the heat environment so that the volume resistivity of the insulating layer is made larger in the area that the temperature becomes high in a temperature distribution of the wafer during heat-treatment to weaken an electrostatic adsorption power and lower a heat conduction of the part brought into contact with the wafer, and on the other hand, the volume resistivity of the insulating layer is made smaller in the area that the temperature of the wafer becomes low to strengthen an electrostatic adsorption power and increase the heat conduction, and thereby they completed the present invention.

Namely, the heating apparatus which has the electrostatic adsorption function of the present invention is a heating apparatus which has the electrostatic adsorption function and which comprises at least a supporting substrate, an electrode for electrostatic adsorption formed on a surface of one side of the supporting substrate; a heating layer formed on a surface of another side of the supporting substrate, and an insulating layer formed so that it may cover the electrode for electrostatic adsorption and the heating layer characterized in that a volume resistivity of the insulating layer is varied in a plane.

Figure 2:
FIG. 2 is a flow diagram showing an example of a method for producing a heating apparatus which has an electrostatic adsorption function according to the present invention.
Figure 2:
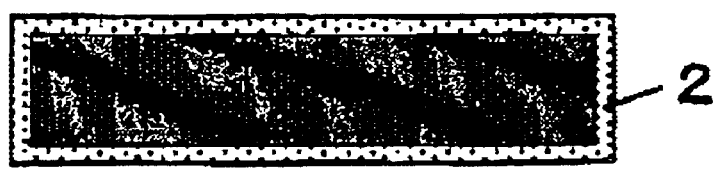
Figure 2:
Figure 2:
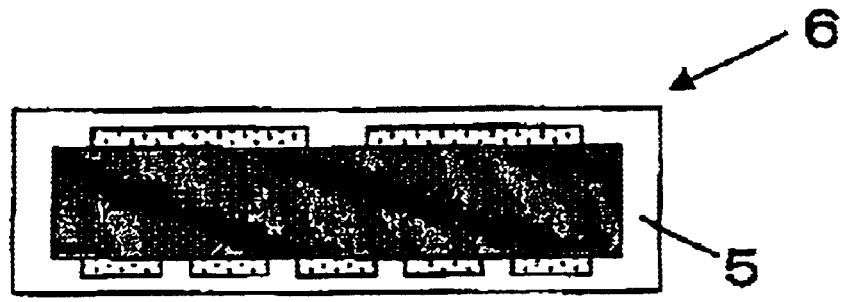
Figure 3A:
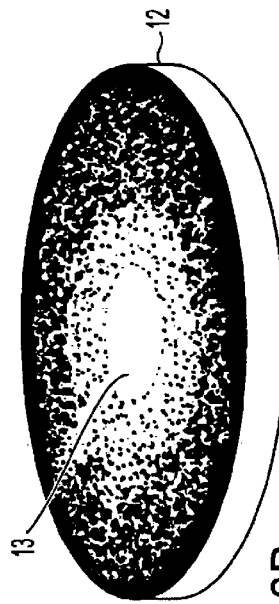
FIGS. 3A to 3D are perspective views of a plane of an insulating layer and graphs of the volume resistivity thereof.
Figure 3C:
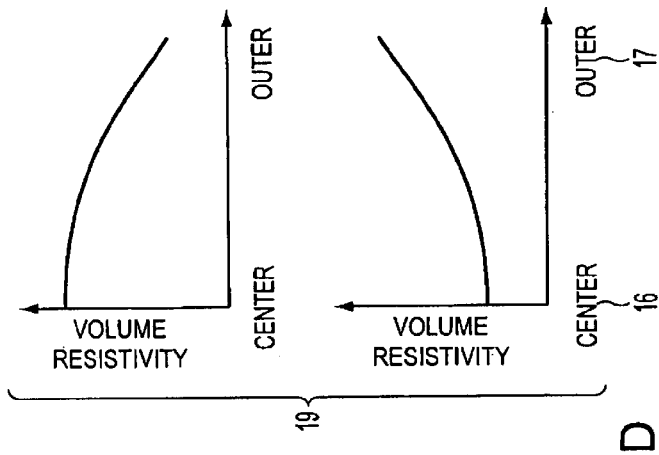
Figure 3B:
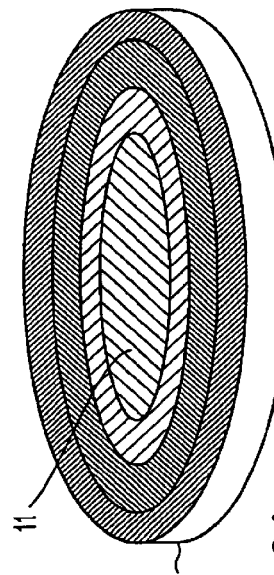
Figure 3D:
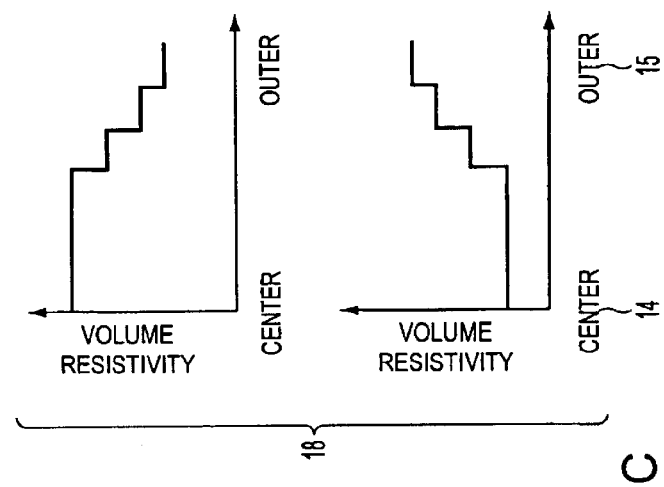

First, the method for producing the heating apparatus which has the electrostatic adsorption function of the present invention will be explained referring to the drawings. The flow diagram showing an example of the method of producing the heating apparatus which has the electrostatic adsorption function of the present invention is shown in FIG. 2.

First, the supporting substrate 1 is prepared (FIG. 2(a)). The material of the supporting substrate 1 prepared at this tire is not limited specifically. However, if it consists of, for example, any one of a silicon nitride sintered body, a boron nitride sintered body, a mixed sintered body of boron nitride and aluminum nitride, an alumina sintered body, an aluminum nitride sintered body and pyrolytic boron nitride coated graphite, the heating apparatus which can perform heat-treatment stably for a long period can be manufactured, since it is excellent in a heat-resistance and strength. Especially, if the supporting substrate consists of pyrolytic boron nitride coated graphite, the influence of the contamination with the impurity contained in the supporting substrate, gas, or the like in the subsequent process for producing the heating-apparatus can be prevented.

Next, an electrode for electrostatic adsorption and a heating layer are formed on the supporting substrate 1. The electrode for electrostatic adsorption and/or the heating layer can be formed by the screen printing or the chemical vapor deposition (CVD).

For example, when forming the electrode for electrostatic adsorption and the heating layer using CVD, as shown in FIG. 2(b), a deposited layer 2 is formed on the supporting substrate by allowing raw material gas to react under the condition of, for example, 1000 to 2500° C. and 1 to 10 Torr. Subsequently, the electrode for electrostatic adsorption 3 and the heating layer 4 can be formed respectively by processing the deposited layer 2 so that a pattern of the electrode for electrostatic adsorption 3 may be formed on one side of the supporting substrate and a pattern of the heating layer 4 may be formed on the other side (FIG. 2(c)).

As described above, the electrode for electrostatic adsorption 3 and the heating layer 4 which have a desired thickness can be formed on the supporting substrate 1 uniformly with a high adhesion property by using CVD, and further a bonding strength of them to the insulating layer formed thereon can be made strong.

Moreover, if the electrode for electrostatic adsorption and the heating layer are formed by the screen printing, the same effect as chemical vapor deposition can be achieved.

Although the thickness of the electrode for electrostatic adsorption 3 and the heating layer 4 to be formed is not limited, it is preferable to be about 10 to 300 $\mu$m, especially 30 to 150 $\mu$m. If the electrode for electrostatic adsorption 3 and the heating layer 4 may be formed in such a thickness, there can be obtained the heating apparatus which can electrostatically adsorb the wafer suitably by the electrode for electrostatic adsorption 3 and can heat the wafer suitably by the heating layer 4.

Moreover, the electrode for electrostatic adsorption and/or the heating layer to be formed preferably consist of any one of gold, a platinum group, silver, a mixture of gold or a platinum group and silver, titanium, tungsten, tantalum, molybdenum, pyrolytic graphite, and pyrolytic graphite containing boron and/or boron carbide. If the electrode for electrostatic adsorption consists of such a material, the electrode can be formed easily, and can electrostatically adsorb the wafer suitably since an electrostatic adsorption power thereof is high. Moreover, if the heating layer consists of the materials as described above, the heating layer can be formed easily and can generates the heat efficiently, without causing troubles such as thermal deformation, burnout and short-circuit.

After forming the electrode for the electrostatic adsorption 3 and the heating layer 4 in both sides of the supporting substrate 1 as described above, the heating apparatus 6 which has an electrostatic adsorption function can be obtained by forming the insulating layer 5 so that it may cover the electrode for electrostatic adsorption 3 and the heating layer 4. At that time, the insulating layer is formed so that the volume resistivity of the insulating layer 5 is varied in a plane, according to the present invention (FIG. 2(d) and FIG. 3A to FIG. 3D.

The insulating layer 5 can be formed easily so that a volume resistivity may be varied in a plane, for example according to CVD using the raw material gas for forming the insulating layer 5 and the dope gas containing the impurity to be contained in the insulating layer 5 with controlling appropriately a mixing ratio of the raw material gas and the dope gas, a flow rate of each gas, a position at which they are supplied, or the like.

More specifically, referring to FIGS. 3A to 3D, the volume resistibility in a plane 10, 12 of the insulating layer can be varied at a distribution such that it may be low at a center part 14, 16 and high at a peripheral part 15, 17 in the shape of a concentric 11, 13 by supplying the dope gas from a nozzle directed to the center part of the substrate when the insulating layer 5 is deposited by a CVD method. By depositing in such a way, a dopant concentration becomes high at a center part and becomes low at a peripheral part. On the contrary, the dopant concentration can be made high at a peripheral part by supplying the dope gas from the peripheral part. Alternatively, by arranging two or more nozzles, a dopant concentration can be varied at each nozzle. In the case of a sintering method, the impurities can be mixed therein with varying an amount of impurities partially when a sintering is performed.

The variation of the volume resistivity 18, 19 of the insulating layer 5 can be controlled suitably depending on the heat environment where the heating apparatus is used or the like, at this time. For example, the temperature distribution of the wafer at the time of heating a wafer in the heat environment where the manufactured heating apparatus is used is investigated beforehand, and the volume resistivity 18, 19 of the insulating layer 5 is changed so that the turbulence of the temperature distribution of the wafer may be offset, namely so that the volume resistivity 18, 19 of the insulating layer 5 may be made smaller to provide a large electrostatic adsorption power in the range where the wafer temperature is low, and the other hand the volume resistivity 18, 19 of the insulating layer may be made larger to provide a small electrostatic adsorption power in the range where the wafer temperature is high. Thereby, the heating apparatus which can heat a wafer uniformly can be manufactured.

In this case, the insulating layer 5 to be formed is preferably formed so that a volume resistivity may be varied in the range of $10^8$ to $10^{18}$ $\Omega \cdot cm$. When the volume resistivity of the insulating layer is smaller than $10^8$ $\Omega \cdot cm$, the device may be broken due to leakage current, as mentioned above. On the other hand, when the volume resistivity of the insulating layer is larger than $10^{18}$ $\Omega \cdot cm$, a sufficient electrostatic adsorption power cannot be obtained, so that it may became sometimes impossible to fix a wafer to the heating apparatus.

Moreover, the insulating layer 5 can consist of any one of silicon nitride, boron nitride, a mixture of boron nitride and aluminum nitride, alumina, aluminum nitride, and pyrolytic boron nitride. If the insulating layer consists of such a material, it is easy to form the insulating layer and the excellent heat-resistance and excellent strengh can be obtained, and therefore, it becomes a insulating layer having a long lifetime which can be used for a long period.

Furthermore, if an impurity is contained in the range of 0.001% to 20% in the insulating layer consisting such a material, the volume resistivity of the insulating layer is easily controlled in the range of $10^8$ to $10^{18}$ $\Omega \cdot cm$. Especially, if the impurity to be contained consists at least one kind of silicon, carbon, boron, germanium, titanium, aluminum, and a nitride thereof, an oxide thereof, and a boride thereof, the volume resistivity can be easily controlled with high precision.

The thickness of the insulating layer 5 to be formed is not limited However, the thickness of the insulating layer 5 is preferably about 50 to 500 $\mu m$, since dielectric breakdown may be caused if the thickness of the insulating layer 5 is, for example, less than 50 $\mu m$, and on the other hand, it is considered that a sufficient electrostatic adsorption power may not be obtained if the thickness of the insulating layer 5 exceeds 500 $\mu m$.

Figure 1:
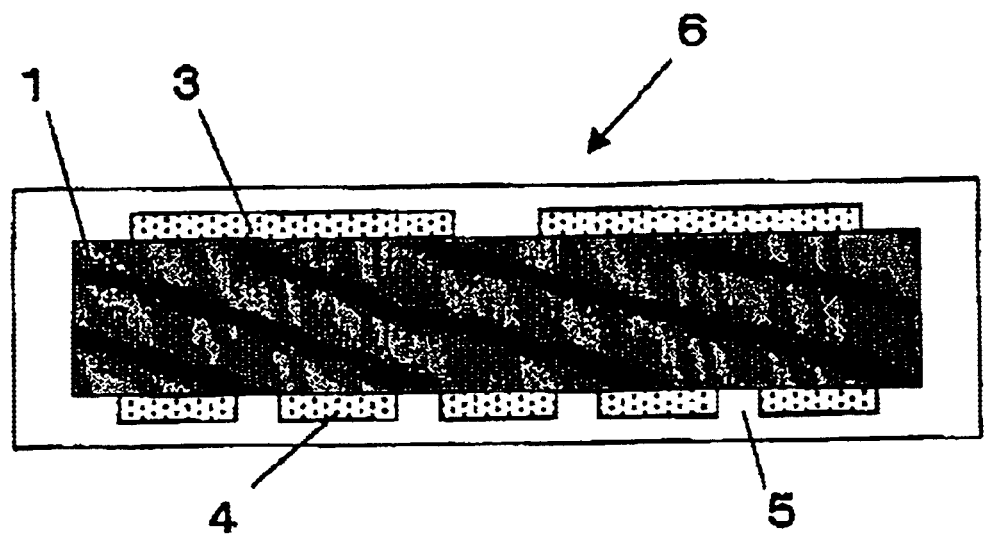
FIG. 1 is a schematic sectional view showing an example of a heating apparatus which has an electrostatic adsorption function of the present invention.

According to the method for manufacture as described above, there can be obtained the heating apparatus 6 as shown in FIG. 1 which has the electrostatic adsorption function and which comprises the supporting substrate 1, the electrode for electrostatic adsorption 3 formed on a surface of one side of the supporting substrate 1, the heating layer 4 formed on a surface of the other side of the supporting substrate 1, and the insulating layer 5 formed so that it may cover the electrode for electrostatic adsorption and the heating layer, wherein the volume resistivity of the insulating layer 5 is varied in a plane.

When the semiconductor wafer or the like is heated by the heating apparatus 6 which has electrostatic adsorption function, the semiconductor wafer can be adsorbed and fixed on the insulating layer 5 in which the volume resistivity is varied in a plane using the electrode for electrostatic adsorption 3 and the wafer can be heated by the heating layer 4 by supplying electric power from an electric supply terminal for electrostatic adsorption and an electric supply terminal for a heating layer (both are un-illustrated) which are provided respectively to the electrode for electrostatic adsorption 3 and the heating layer 4.

According to the heating apparatus 6 which has an electrostatic adsorption function, the electrostatic adsorption power at the time of adsorbing a wafer to the heating apparatus can be varied in a plane by the difference in the volume resistivity in a plane of the insulating layer. And by using the difference in the electrostatic adsorption power, the turbulence of the temperature balance in a plane of the wafer generated when the wafer is heated can be offset, and thereby the uniformity of the temperature distribution of the wafer can be significantly improved. Therefore, there can be suppressed the aggravation of the temperature distribution of the electrostatically adsorbing apparatus itself which has been caused conventionally by the heat environment, the aggravation of the temperature distribution of the wafer itself caused by contact of gas or plasma to the wafer, and thereby the wafer can be heat-treated uniformly.

Especially, if the volume resistivity of the insulating layer is varied in the shape of a concentric circle in the above-mentioned heating apparatus 6, the temperature distribution produced in the shape of a concentric circle of the wafer can be offset, and the wafer can be heat-treated uniformly, even in the case that the wafer with a large diameter is heat-treated in a single wafer processing. Therefore, the nonuniformity of the device characteristics conventionally caused in the shape of a concentric circle especially in the wafer with a large diameter as described above can be improved, and lowering of the yield can be surely prevented.

EXAMPLES

The following example and comparative example are being submitted to further explain the present invention specifically. However, the present invention is not limited thereto.

Example

First, the graphite substrate with a diameter of 200 mm and a thickness of 20 mm was prepared. Then, the mixed gas of ammonia and boron trichloride was allowed to react thereto under the condition of 1800° C. and 100 Torr, to produce the pyrolytic boron nitride coated graphite in which pyrolytic boron nitride was formed on the graphite substrate, which was used as the supporting substrate.

Subsequently, methane gas was pyrolyzed on this supporting substrate, under the condition of 2200° C. and 5 Torr, and the pyrolytic graphite layer with a thickness of 100 $\mu m$ was formed. Then, the electrode pattern was processed on one surface of the formed pyrolytic graphite layer to form the electrode for electrostatic adsorption, and the heater pattern was processed on the other surface to form the heating layer.

After forming the electrode for electrostatic adsorption and the heating layer, a mixed gas of ammonia, boron trichloride, methane, and silicon tetrachloride was allowed to react under the condition of 2000° C. and 5 Torr, with controlling a quantity of gas flow, to form the insulating layer with a thickness of 200 $\mu m$ which consists of pyrolytic boron nitride containing boron carbide on both sides of the support substrate (methane was supplied from the periphery of the supporting substrate). At this time, the boron-carbide content of the insulating layer from the center to the peripheral part was gradually varied from 0.1 to 5% by weight in the shape of a concentric circle so that the uniform temperature distribution of the wafer can be achieved when the wafer is heated with the manufactured heating apparatus.

After forming the insulating layer, the insulating layer on the side of the electrode for electrostatic adsorption to be a wafer adsorption surface was subjected to mirror polishing, and thereby the heating apparatus which has an electrostatic adsorption function was produced. The volume resistivity 18, 19 of the insulating layer in the produced heating apparatus was measured at this time. It was $2 \times 10^{14}$ Ω·cm in the center part of the insulating layer, and was gradually lowered from $2 \times 10^{14}$ Ω·cm of the center 14, 16 of the insulating layer to $5 \times 10^{10}$ Ω·cm of the peripheral part 15, 17.

Comparative Example

For comparison, the heating apparatus which has an electrostatic adsorption function was produced in the same manner as the above-mentioned example except that the mixed gas of ammonia, boron trichloride, and methane was allowed to react under the condition of 2000° C. and 5 Torr to form the insulating layer consisting of pyrolytic boron nitride with a thickness of 200 μm which contains uniformly 2% by weight of a boron carbide on the whole surface. The volume resistivity of the insulating layer of the produced heating apparatus was measured, it was $5 \times 10^{11}$ Ω·cm in any area of the insulating layer.

Next, each of the heating apparatuses having the electrostatic adsorption function produced by the above-mentioned example and the comparative example was installed into the CVD apparatus. Then, by impressing voltage of approximately ±1 kV to the electrode for electrostatic adsorption, the silicon wafer with a diameter of 200 mm in which a thermocouple was embedded was electrostatically adsorbed thereto, and at the same time a voltage was impressed to the heating layer to heat the wafer so that a temperature of the center of the wafer became 400° C. After heating the wafer until a temperature of the center of the wafer became 400° C., it was kept at the temperature for 5 minutes, and stabilized thermally. Then, a temperature distribution in a radial direction of the silicon wafer was measured in the state.

The measurement results of the temperature distribution of the silicon wafer heated with each of the heating apparatuses of the example and the comparative example are shown in the following table 1.

TABLE 1

| Distance from center of Wafer (Diameter of 200 mm) | Example | | | Comparative example | | |
|---|---|---|---|---|---|---|
| | Boron carbide Content (% by weight) | Volume Resist-ibility (Ω · cm) | Wafer Tem-perature (° C.) | Boron carbide Content (% by weight) | Volume Resist-ibility (Ω · cm) | Wafer Tem-perature (° C.) |
| 0 (center) | 0.1 | $2 \times 10^{14}$ | 400 | 2 | $5 \times 10^{11}$ | 400 |
| 25 | 0.5 | $4 \times 10^{13}$ | 401 | 2 | $5 \times 10^{11}$ | 398 |
| 50 | 1 | $3 \times 10^{12}$ | 399 | 2 | $5 \times 10^{11}$ | 390 |
| 75 | 2 | $5 \times 10^{11}$ | 398 | 2 | $5 \times 10^{11}$ | 385 |
| 95 | 5 | $5 \times 10^{10}$ | 396 | 2 | $5 \times 10^{11}$ | 381 |
| | | ΔT | 5 | | ΔT | 19 |

It is apparent from the table 1 that in the case of the silicon wafer heated using the heating apparatus (Example) wherein the volume resistivity 18, 19 of the insulating layer is varied in the shape of a concentric circle 11, 13, a temperature-difference ΔT in a plane of the wafer is as small as 5° C., and the temperature distribution of the wafer is very uniform. On the other hand, in the case of the silicon wafer heated using the heating apparatus (comparative Example) wherein the volume resistivity of the insulating layer is uniform, at the closer to the peripheral part of the silicon wafer the temperature of the wafer becomes low, and a temperature-difference ΔT in a plane of the wafer is as large as 19° C., and thus the temperature distribution of the wafer is degraded.

From the above results, it was confirmed that the uniformity of the temperature distribution of the wafer is significantly improved by heating the wafer using the heating apparatus which has the electrostatic adsorption function of the present invention.

The present invention is not limited to the above-described embodiment. The above-described embodiment is a mere example, and those having the substantially same structure as that described in the appended claims and providing the similar action and effects are included in the scope of the present invention.

For example, although the insulating layer of the heating apparatus which has an electrostatic adsorption function is formed by CVD in the above embodiment, the present invention is not limited thereto, and any method can be used as far as the insulating layer wherein the volume resistivity is varied in a plane can be formed.

What is claimed is:

1. A heating apparatus which has an electrostatic adsorption function and which comprises at least a supporting substrate, an electrode for electrostatic adsorption formed on a surface of one side of the supporting substrate, a heating layer formed on a surface of the other side of the supporting substrate, and an insulating layer formed so that it covers the electrode for electrostatic adsorption and the heating layer wherein a volume resistivity of the insulating layer is varied in a shape of a concentric circle in a plane.

2. The heating apparatus which has an electrostatic adsorption function according to claim 1 wherein the volume resistivity is varied in the range of $10^8$ to $10^{18}$ Ω·cm.

3. The heating apparatus which has an electrostatic adsorption function according to claim 1 wherein the insulating layer consists of silicon nitride, boron nitride, a mixture of boron nitride and aluminium nitride, alumina, or aluminium nitride, and the insulating layer contains impurity in the range of 0.001% to 20%.

4. The heating apparatus which has an electrostatic adsorption function according to claim 3 wherein the boron nitride is pyrolytic boron nitride.

5. The heating apparatus which has an electrostatic adsorption function according to claim 4 wherein the impurity contained in the insulating layer is at least one kind of impurity selected from the group consisting of silicon, carbon, boron, germanium, titanium, aluminium and nitrides, oxides and borides thereof.

6. The heating apparatus which has an electrostatic adsorption function according to claim 3 wherein the impurity contained in the insulating layer is at least one kind of impurity selected from the group consisting of silicon, carbon, boron, germanium, titanium, aluminium and nitrides, oxides and borides thereof.

7. The heating apparatus which has an electrostatic adsorption function according to claim 1 wherein the supporting substrate consists of any one of a silicon nitride sintered body, a boron nitride sintered body, a mixed sintered body of boron nitride and aluminium nitride, an alumina sintered body, an aluminium nitride sintered body, and pyrolytic boron nitride coated graphite.

8. The heating apparatus which has an electrostatic adsorption function according to claim 1 wherein the electrode for electrostatic adsorption and/or the heating layer are formed by screen printing or chemical vapor deposition.

9. The heating apparatus which has an electrostatic adsorption function according to claim 1 wherein the electrode for electrostatic adsorption and/or the heating layer consist of any one of gold, a platinum group, silver, a mixture of gold or a platinum group and silver, titanium, tungsten, tantalum, molybdenum pyrolytic graphite and pyrolytic graphite containing boron and/or boron carbide.

10. A method for producing a heating apparatus which has an electrostatic adsorption function by forming at least an electrode for electrostatic adsorption and a heating layer on a supporting substrate and then forming an insulating layer so that it covers the electrode for electrostatic adsorption and the heating layer wherein the insulating layer is formed so that a volume resistivity is varied in a shape of a concentric circle in the insulating layer.

* * * * *